United States Patent [19]

Lindenfelser et al.

[11] Patent Number: 4,721,685
[45] Date of Patent: Jan. 26, 1988

[54] SINGLE LAYER POLY FABRICATION METHOD AND DEVICE WITH SHALLOW EMITTER/BASE JUNCTIONS AND OPTIMIZED CHANNEL STOPPER

[75] Inventors: Timothy M. Lindenfelser, Eagan; David A. Hanson, Apple Valley, both of Minn.

[73] Assignee: Sperry Corporation, New York, N.Y.

[21] Appl. No.: 853,792

[22] Filed: Apr. 18, 1986

[51] Int. Cl.[4] .................. H01L 21/265; H01L 21/20; H01L 21/425

[52] U.S. Cl. ...................................... 437/31; 357/34; 357/91; 437/33; 437/70

[58] Field of Search ............... 29/576 B, 578; 148/1.5, 148/187; 357/34, 91

[56] References Cited

U.S. PATENT DOCUMENTS

| | | | |
|---|---|---|---|
| 4,387,953 | 5/1983 | Ho et al. | 148/1.5 |
| 4,437,897 | 3/1984 | Kemlage | 148/1.5 |
| 4,440,580 | 6/1984 | Gahle | 148/1.5 |
| 4,477,965 | 10/1984 | Blossfeld | 29/576 B |
| 4,535,531 | 8/1985 | Bhatia et al. | 29/577 C |
| 4,573,256 | 3/1986 | Lechaton et al. | 29/576 B |
| 4,573,257 | 3/1986 | Hulseweh | 29/576 B |
| 4,622,738 | 11/1986 | Gwozdz et al. | 29/576 B |

*Primary Examiner*—Upendra Roy
*Attorney, Agent, or Firm*—Charles A. Johnson; Douglas T. Tshida

[57] ABSTRACT

A method for fabricating high performance bipolar transistors using a single polycrystalline silicon layer whereby horizontally and vertically scaled base/emitter junctions are achieved. In an extrinsic base transistor, a composite sandwich of overlying layers of poly silicon, oxide and nitride are deposited over a substrate containing field oxide isolated monocrystalline transistor sites having buried subcollectors and sinker regions. The composite sandwich is thereafter selectively oxidized to define base, emitter and collector regions with the relative thickness of the composite sandwich and the grown oxide being controlled to assure proper horizontal extrinsic base to emitter spacings and shallow vertical intrinsic base to emitter junctions, upon completing subsequent implant and annealing steps. Each active transistor site is also surrounded by a ring-like, channel stopper which is physically isolated from the channel stopper of each other device.

21 Claims, 9 Drawing Figures

SINGLE LAYER POLY FABRICATION METHOD AND DEVICE WITH SHALLOW EMITTER/BASE JUNCTIONS AND OPTIMIZED CHANNEL STOPPER

BACKGROUND OF THE INVENTION

The present invention relates to field oxide isolated, extrinsic base bipolar devices and in particular to a method utilizing a single polycrystalline silicon layer whereby respective vertical emitter/base junctions and horizontal extrinsic base/emitter spacings may be scaled relative to one another.

With the ever present demands of the computer industry for performance improvements and enhanced functionality has come a desire to improve upon device construction and integrated circuit processing techniques so as to achieve methodologies and devices that lend themselves to high packing densities, optimal performance parameters and high processing yields. In the field of bipolar devices and, in particular, field oxide isolated devices, device performance can be improved by more critically controlling the vertical structure of the emitter/base junction as well as the horizontal spacing between the extrinsic base and emitter regions.

In this regard, polycrystalline silicon (hereinafter also referred to as poly silicon) has found a number of uses in various processes for achieving self-aligned devices and one of which is disclosed in U.S. Pat. No. 4,437,897. There a combined layer of polycrystalline silicon and silicon dioxide are used in a single base implant process for controlling the geometry of the extrinsic base regions. The polysilicon is also used in combination with subsequent nitride and oxide layers, an emitter etch and an emitter implant to achieve a shallow emitter/base junction and wherein a portion of the junction is also contained within the poly silicon.

Still other bipolar processes using polycrystalline silicon in the control of base/emitter geometries are disclosed in a paper by Sakai et. al., *Elevated Electrode Integrated Circuits, IEEE Transactions of Electron Devices*, Vol. Ed-24, No. 4, April, 1979, pp. 379-384; a book, edited by L. Esaki and G. Soncini, *Large Scale Integrated Circuits Technology: State of the Art and Prospects* (Martinus, Nijhoff, The Hague, 1982), pp. 381-384; a paper by Vora et. al., *A 2 Micron High Performance Bipolar 64K ECL Static RAM Technology with 200 Square Microns Contactless Memory Cell*, IEDM (1984), pp. 690-693; and a paper by Ashburn et. al., *Comparison of Experimental and Theoretical Results on the Poly Silicon Emitter Bipolar Transmitters*, 31 *IEEE Transactions on Electron Devices*, pp. 853-859 (July, 1984).

In each of the latter publications, poly silicon is used as a diffusion source during device processing, although in a different fashion from the present invention, to achieve self-aligned base emitter regions with shallow emitter junctions. It is also to be noted that the latter Ashburn paper discloses the growth of a chemical oxide intermediate the epitaxial layer and the poly silicon in the region of the emitter and whereby improved transmistor gains are obtained.

One other feature of note which is commonly used in the construction of field oxide isolated bipolar transistors is a so-called channel stopper and which is typically implanted beneath the field oxide to reduce parasitic collector-substrate capacitance. Specifically and as noted in U.S. Pat. No. 4,437,897, a channel stopper is provided about each active site in horizontal coextensive relation to the field oxide. While the channel stoppers are also commonly coupled to one another in the form of a matrix, it has been discovered that by separating each channel stopper from the sub-collector of each active site that parasitic device capacitance can be reduced. Until the present invention though, a barrier or limit has existed to the possible reduction of this capacitance, due to the attendant out-diffusion or auto doping that is believed to occur during the annealing of the implanted channel stopper.

SUMMARY OF THE INVENTION

It is therefore a primary object of this invention to achieve a self-aligned process using a single poly silicon layer for producing shallow emitter, horizontally scaled extrinsic base bipolar devices.

It is a further object to achieve devices with improved or reduced collector-substrate capacitance.

These and other objects are achieved in an improved method which includes the growing of a thin layer of chemical oxide over a monocrystalline semiconductor substrate having a plurality of monocrystalline silicon transistor sites isolated from one another by planarized field isolation regions and within which sites are there formed a buried layer or sub-collector and a collector sinker or reach-through region. Controlled thicknesses of polycrystalline silicon, oxide and nitride are next grown over the chemical grown oxide. Thereafter, the oxide and nitride layers are etched through a masked photo resist to the poly silicon and which etched regions are subsequently oxidized to define and isolate the base, emitter and collector regions from one another. The relative thickness of the grown oxide and the adjacent composite of poly silicon/nitride/oxide layers are particularly controlled to exhibit a similar resistance to implant during subsequent processing to assure devices of desired geometries.

In particular, an intrinsic base dopant is next generally implanted over the base and emitter regions. Subsequently and in successive order, extrinsic base regions are masked off in conventional fashion with a photo resist and subjected to an extrinsic base dopant implant. Thereafter, the oxide and nitride layers in the area of the emitter are etched away, before the emitter regions are masked off and an emitter dopant is implanted. The substrate is next annealed with the vertically stacked dopants being driven into the monocrystalline silicon to form the extrinsic and intrinsic base and emitter regions. Next, platinum is deposited over the poly silicon contact regions and sintered, before a contact glass is deposited and contact openings are made therethrough in between successive lithographic, etching and metal deposition steps.

A further feature of the invention comprises the initial preparation of the foregoing substrate to include isolated, geometrically defined channel stopper regions of relative widths less than the intended field oxide regions. Each channel stopper is physically separated from each other channel stopper and the buried layer or sub-collector regions by a predetermined spacing to form a ring around the active transistor sites and whereby collector-substrate capacitance has been found to be reduced in half over previously known methodologies.

The foregoing objects, advantages and distinctions of the invention over the prior art, as well as others, will however become more apparent upon directing attention to the following description thereof and the appended drawings. Before referring thereto though, it is to be appreciated that the following description is made by way of the presently preferred embodiment only and thus should not be interpreted in any way to be self-limiting.

BRIEF DESCRIPTION OF THE DRAWINGS

The following drawings generally illustrate the method and resulting improved bipolar transistors of the present invention relative to a single active transistor site in a monocrystalline silicon substrate. Similar reference numerals therefore serve to indicate similar structure therebetween. In particular.

DESCRIPTION OF THE PREFERRED EMBODIMENT

Figure 1:
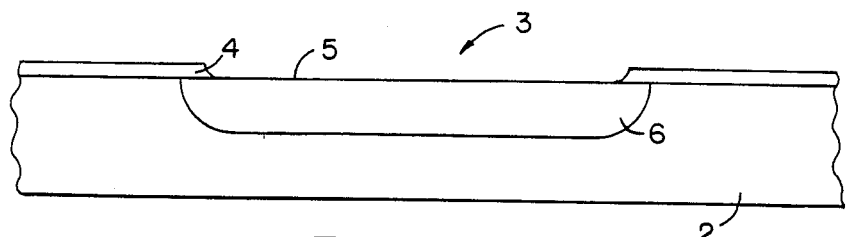
FIG. 1 shows a cross-section view through the substrate after a buried layer or sub-collector anneal operation.

Before turning attention to FIG. 1, it is to be recalled that the subject invention relates to the field of bipolar integrated circuits and, in particular, to a field oxide isolated structure having an improved channel stopper region. Each device is also constructed using a single layer polycrystalline silicon methodology and whereby optimized self-aligned extrinsic base and emitter regions are achieved upon implanting dopants through a tailored nitride-oxide-poly composite sandwich of layers relative to adjacent oxide regions. Various of the intervening processing steps, which are well known to those of skill in the art, will accordingly not be disclosed in detail, although it is expected that one of skill in the art would be readily familiar therewith. The following description will therefore be principally directed to the portions of the process wherein the invention lies, while only cursorily addressing these various steps and/or structures. Furthermore, the invention will be described with respect to a single active transistor site, recognizing that the substrate contains numerous other sites which are processed in an identical fashion.

Turning attention to FIG. 1, a cross-section view through a partially prepared transistor site 3 is shown relative to a portion of the single crystal silicon wafer 2. Specifically, the wafer 2 comprises a P- type single crystal silicon, approximately 525 microns thick with a resistivity of 25 to 45 ohms per centimeters. During the initial process steps, each of the active transistor sites 3 is defined using conventional lithography and masking procedures. After forming a buried alignment mark (not shown), an oxide layer 4 is generally grown over the entire wafer 2. The active sites 3 are next masked off and wet etched through the oxide layer 4, with a slight over-etch. A thermal screen oxide 5 is then grown over each active site 3 to protect it during subsequent steps of implanting a buried layer or subcollector dopant of antimony (N+), cleaning and annealing of the buried layer or sub-collector 6.

Figure 2:
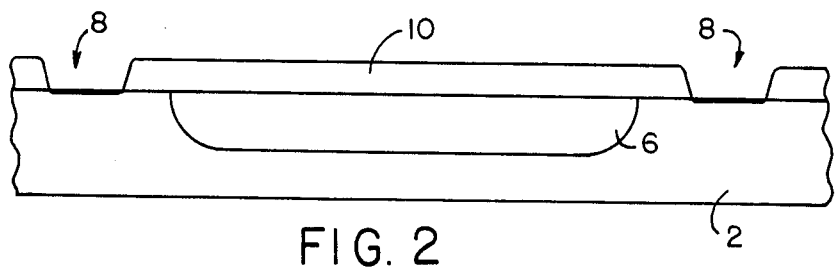
FIG. 2 shows a cross-section view after channel stopper mask and implantation steps.

A channel stopper implant region 8 is next defined in a masked photo resist 10, see FIG. 2, in surrounding relation to each sub-collector 6 of each transistor site 3. In this regard, it is to be noted that previously the channel stopper regions were defined to extend between each active site 3, as well as being physically connected with the channel stopper of each other site 3. Studies later confirmed that the attendant collector to substrate capacitance for such configurations could be reduced by separating the channel stopper regions from the buried layer or sub-collector 6. An optimum separation however was experienced at approximately 5 microns and whereafter additional separation appeared to have no further advantage, apparaently due to inherent auto doping which occurs during the annealing of the channel stopper implant.

In an improvement thereover, the present invention utilizes isolated ring-like channel stopper implant regions 8 which surround each active transistor site 3. Each implant region 8 is also physically isolated from each other region 8, is separated from the sub-collector 6 and is of a width substantially less than a later grown field oxide. In particular, each channel stopper implant region 8 is approximately 2 microns wide and is separated approximately 5 microns from the sub-collector 6 while the field oxide extends a significant distance therebeyond to the adjacent sites. (The actual field oxide width typically depends on the numbers of conductive paths routed thereover and/or other circuit constraints, but is commonly sized in widths in excess of ten microns.) Such an isolated configuration is found to yield improvements over prior art devices with the collector to substrate capacitance being reduced by aproximately one-half. It is postulated that such improvements result from the reduced presence of channel stopper dopant and which reduces the amount of auto doping or out-diffusion that might otherwise occur during the annealing of the channel stopper.

Figure 3:
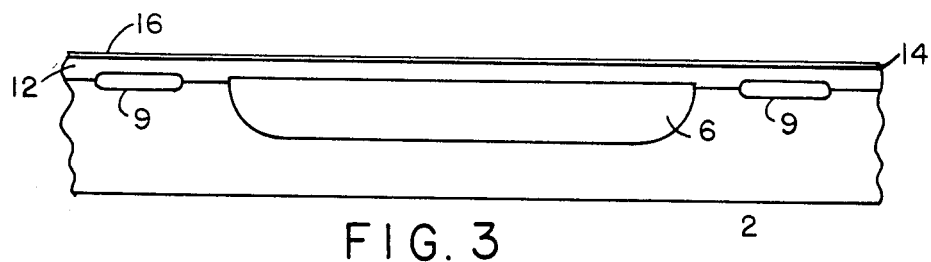
FIG. 3 shows a cross-section view after an annealing of the channel stopper and the growth of overflying oxide and nitride layers.

In any case and returning attention to FIG. 2, ring-like isolated channel stopper implant regions 8 of an approximate width of 2 microns and a 5 micron spacing from the buried layer 6 are defined through a lithographically deposited photo resist layer 10. The wafer is thereafter subjected to a boron or P+ implant of 6.30 E$^{13}$ atoms/centimeters$^2$ at 150 Kev and after which the implant dopant is annealed to form the channel stopper 9. The photo resist 10 is next stripped from the wafer 2 with a plasma etch and the wafer 2 is cleaned preparatory to growing an N- epitaxial layer 12, oxide layer 14 and nitride layer 16 as shown in FIG. 3.

Figure 8:
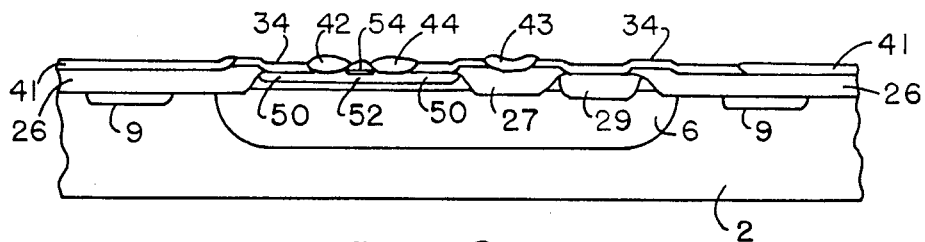
FIG. 8 shows a cross-section view after an emitter and base anneal.
Figure 9:
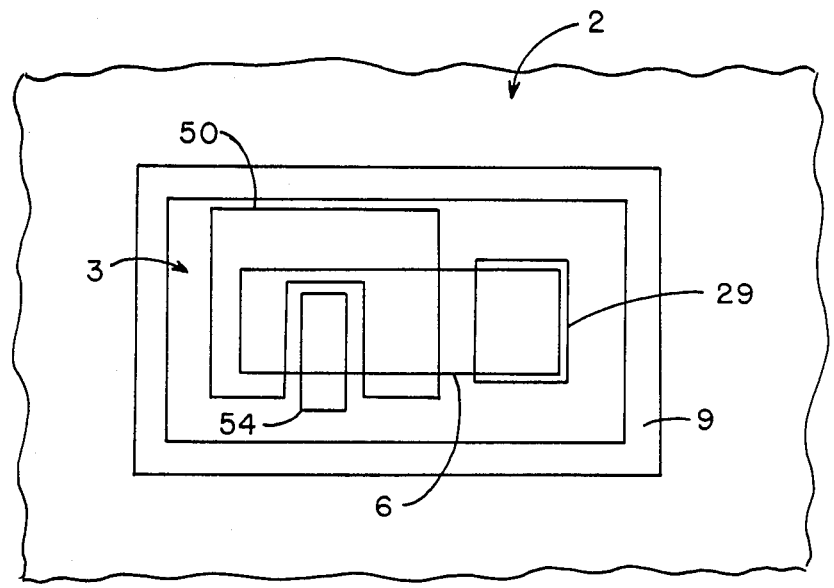
FIG. 9 shows a top view of the ring-like channel stopper relative to the buried sub-collector, sinker, base and emitter regions.

Before turning attention to the other improvements of the subject invention, attention is further directed to FIG. 9 and wherein a topographic view is shown of the thus formed ring-like channel stopper 9 relative to the transistor's extrinsic base 50, emitter 54, subcollector 6 and sinker 29 and which will be described in greater detail hereinafter. Specifically, it is to be noted that the channel stopper 9 only surrounds its adjacent active region 3 and is not physically connected to any other channel stopper. Furthermore, it lies beneath only a small portion of the surrounding field oxide 26, see FIG. 8. While shown and described with specific dimensional characteristics, it is also to be appreciated that the presently improved channel stopper 9 should not be limited to the particular construction shown, in that depending upon the active device construction, various other ring-like geometries and spacings may prove equally advantageous.

Figure 4:
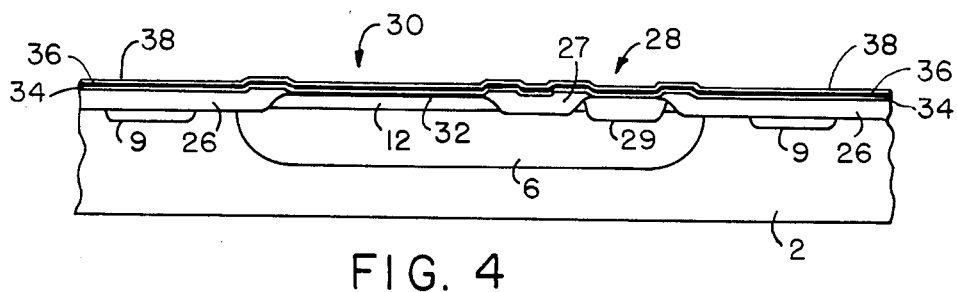
FIG. 4 shows a cross-section view of the planarized substrate after forming the ring-like channel stopper, a buried layer, collector sinker and field oxide isolation regions relative to the intended base/emitter region and in overlying relation to which successive layers of a chemical oxide, poly silicon, oxide and nitride have been deposited.

With the preparation of the channel stoppers 9 and directing attenuation to FIG. 4, the wafer 2 is next subjected to successive steps wherein, as mentioned, an epitaxial layer 12 is grown over the wafer 2. Overlying oxide and nitride layers 14 and 16 are next grown and the active transistor sites 3 are lithographically masked off with a photo resist, before etching away slightly more than 50% of the epitaxial layer 12. The wafer 2 is then subjected to an oxidizing atmosphere and field oxide regions 26 are grown over the wafer 2 to isolate each active transistor site from its neighbor. A walled oxide 27 is also grown within each active site 3 to isolate each site's collector reach-through region or sinker implant region 28 from the adjacent base/emitter implant region 30.

The remaining nitride layer 16 is thereafter stripped and the wafer 2 is lithographically masked off with a photo resist to expose each sinker implant region 28, before being subjected to a phosphorous or N+ sinker implant. Upon annealing the sinker implant dopant, a sinker 29 is formed and whereby the sub-collector 6 is electrically connected to the wafer surface. The wafer 2 is next cleaned and coated with a photo resist and subjected to a dry plasma etch, whereby the upper wafer surface is planarized.

Thereafter, the wafer 2 is cleaned and a chemical oxide layer 32, approximately 10 to 30 angstroms thick, is grown thereover, prior to the deposition of a poly silicon layer 34. Specifically, the chemical oxide layer is grown by successively exposing the wafer 2 in a cleaning operation, first to caros acid for approximately 10 minutes; $H_2O/HF$ 7:1 for 5 seconds; $NH_4OH/H_2O_2/H_2O$ for 10 minutes and $HCl/H_2O_2/H_2O$ for 10 minutes.

Where previously, conventional practice dictated the cleaning of the wafer surface of all oxides, it has been discovered that the inclusion of a relatively thin, chemically grown oxide beneath the emitter enhances the transistor's gain and which is desirable for the present high performance transistors. While being shown in FIG. 4 to exist in the base/emitter implant region 30, it is to be appreciated that the layer 32 will ultimately only exist between the intrinsic base and emitter and whereby improved gain characteristics are achieved.

Upon cleaning the wafer 2 and growing the chemical oxide layer 32, a poly silicon layer 34 is grown to a thickness of approximately 2,200±200 angstroms. An oxide layer 36 is next grown over the poly layer 34 to a thickness of 450±50 angstroms (and which relative to the Figures at the scale shown appears as a darkened line) and after which a nitride layer 38 is grown to a thickness of 1,100±100 angstroms. The layers 34, 36 and 38, as will become apparent hereinafter, are used to self-align the base and emitter regions to one another and the base, emitter and collector contacts to the corresponding active regions of the transistor site. It is at this point therefore that the process is again depicted and which continues from FIG. 4.

Figure 5:
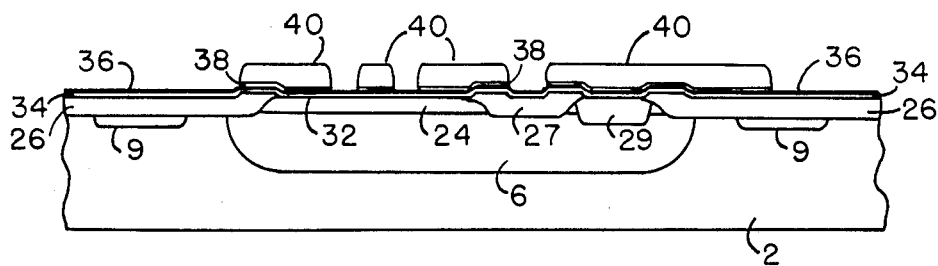
FIG. 5 shows a cross-section view after masking and etching the nitride and oxide layers and prior to the oxidation of the exposed poly silicon to define extrinsic base, emitter and collector regions.
Figure 6:
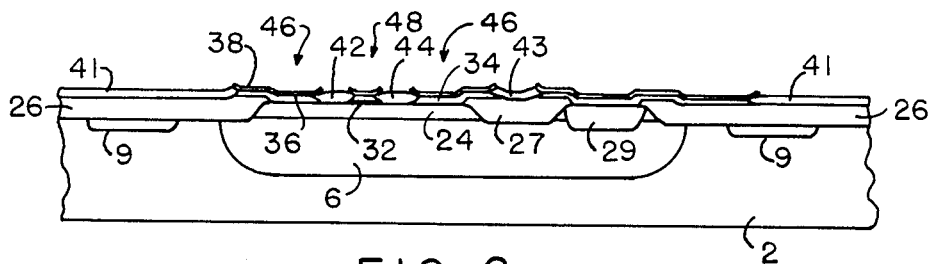
FIG. 6 shows a cross-section view after oxidizing the poly silicon and implanting an intrinsic base dopant.

Next, portions of the poly silicon layer 34 are oxidized and in regard to which attention is directed to FIG. 5, and wherein a photo resist 40 has been lithographically deposited over the wafer 2, with the nitride and oxide layers 38 and 36 being etched from the exposed regions. The wafer 2 is then subjected to an oxidizing atmosphere whereby the exposed portions of the poly silicon layer 34 are oxidized to form isolation regions 41, 42, 43 and 44, as shown in FIG. 6. Each isolation region being of an approximate thickness of 4,700±300 angstroms. In so doing, extrinsic base and emitter implant windows 46 and 48 are also defined and the ultimately formed base, emitter and collector contact regions are isolated from one another. The various regions of each active site 3 is thus horizontally scaled relative to one another and, in particular, a 1.25 micron spacing is defined between the extrinsic base and emitter regions 46 and 48 via the oxide regions 42 and 44.

Figure 7:
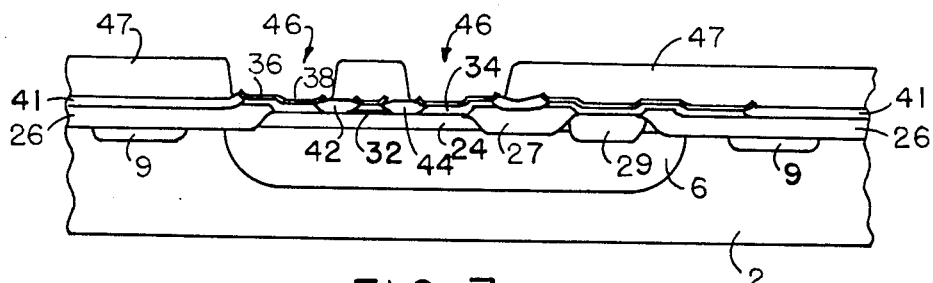
FIG. 7 shows a cross-section view after depositing an extrinsic base implant mask.

Upon striping the resist 40 from the wafer 2, the wafer 2 is subjected to a boron or intrinsic base implant and which penetrates uniformly across and through the remaining sandwiched layers of nitride 38, oxide 36 and poly silicon 34 and the oxide regions 42 and 44. The extrinsic base regions 46, as shown in FIG. 7, are next lithographically masked off via a photo resist 47 and subjected to an extrinsic base implant of another dosage of boron and whereafter the emitter region 48 is masked off and subjected to an implant dosage of arsenic or N+ dopant. Thereafter, the surface of the wafer 2 is cleaned and the wafer is annealed, with the vertical profile of the extrinsic base 50, intrinsic base 52 and emitter 54 being defined thereby as shown in FIG. 8.

In particular and in the preferred embodiment, upon annealing the wafer 2 at 1000 degrees centigrade in a nitrogen atmosphere for approximately 30 minutes, the dopants diffuse into the epitaxial layer 24 with the extrinsic base dopant diffusing approximately 4300 angstroms, the intrinsic base dopant approximately 3300 angstroms and the emitter dopant approximately 1500 angstroms. (While not shown, it is also to be appreciated that the layer of chemical oxide 32 still exists between the emitter 54 and intrinsic base 52.)

With the preparation of the active transistor regions, processing proceeds in a conventional manner. That is, a layer of platinum is deposited over the base, emitter and collector contact regions, before being sintered and covered with a contact oxide or glass and relative to which openings are made during successive metal interconnect depositions, as required by the particular circuit configuration.

While the present invention has been described with respect to its presently preferred embodiment, it is to be appreciated that numerous variations may be made thereto by those of skill in the art in accordance wtih the principles of the disclosed invention. Accordingly, it is contemplated that the following claims should be interpreted so as to include all those equivalent embodiments within the spirit and scope thereof.

What is claimed is:

1. In a process for forming a transistor, the steps of:
   (a) depositing a layer of a polycrystalline silicon over a semiconductor substrate including a plurality of transistor sites isolated from one another by a surrounding electrical insulator wherein each transistor site includes an epitaxial layer and a lower-lying sub-collector region;
   (b) thermally forming a silicon dioxide layer over said polycrystalline silicon layer;
   (c) depositing a silicon nitride layer over said silicon dioxide layer;
   (d) exposing portions of the silicon dioxide layer over said epitaxial layer;
   (e) oxidizing the exposed silicon dioxide layer through the underlying polycrystalline silicon layer to the epitaxial layer to electrically define a base area and an emitter area within said epitaxial layer and such that the thus grown oxide and the unetched sandwiched layers of silicon nitride, silicon oxide and polycrystalline silicon over said epitaxial layer exhibit substantially similar resistances to ion implant; and
   (f) ion implanting a dopant into said epitaxial layer through the overlying grown oxide and the sandwiched layers of silicon nitride silicon oxide and polycrystalline silicon whereby a uniform vertical doping profile is obtained over the implant area.

2. A process as set forth in claim 1 including the further step of:
   (a) depositing a photo resist except over said base area; and
   (b) ion implanting a second base dopant into said epitaxial layer.

3. A process as set forth in claim 1 wherein the silicon oxide layer is deposited to a thickness in the range of 100 to 800 angstroms, the silicon nitride layer is deposited to a thickness in the range of 650 to 1500 angstroms, the polycrystalline silicon is deposited to a thickness in the range of 1000 to 4000 angstroms and the thermal oxide is grown to a thickness in the range of 2000 to 8000 angstroms.

4. A process as set forth in in claim 1 including the step of:
   (a) chemically growing a silicon oxide layer over said substrate prior to depositing said polycrystalline silicon layer.

5. A process as set forth in claim 4 wherein said chemical oxide is grown to a thickness in the range of 10 to 40 angstroms.

6. A process as set forth in claim 5 wherein said chemical oxide is grown by sequentially exposing said substrate to caros acid, $H_2O/HF$ 7:1, $NH_4OH/H_2O_2/H_2O$ and $HCl/H_2O_2/H_2O$.

7. In a process for forming a transistor, the steps of:
   (a) depositing a layer of a polycrystalline silicon over a semiconductor substrate containing isolation regions, an epitaxial layer, a sub-collector region and a collector sinker region;
   (b) thermally forming a silicon dioxide layer over said polycrystalline silicon layer;
   (c) depositing a silicon nitride layer;
   (d) etching away portions of said nitride layer to expose portions of the oxide layer over said isolation regions and said epitaxial layer;
   (e) thermally oxidizing the oxide layer and polycrystalline silicon layer in the areas of exposure to define a base area and an emitter area within said epitaxial layer and such that the grown oxide and the unetched sandwiched layers of silicon nitride, silicon oxide and polycrystalline silicon over said epitaxial layer exhibit substantially similar resistances to ion implant;
   (f) ion implanting a first base dopant into said epitaxial layer through the overlying grown oxide and the sandwiched layers of silicon nitride, silicon oxide and polycrystalline silicon;
   (g) depositing a first photo resist over said isolation region and a first portion of said epitaxial layer;
   (h) ion implanting a second base dopant into said epitaxial layer;
   (i) depositing a second photo resist over said isolation region and a second portion of said epitaxial layer;
   (j) ion implanting an emitter dopant into said epitaxial layer; and
   (k) annealing said substrate to drive said first and second base dopants and said emitter dopant into said epitaxial layer to form transistor extrinsic and intrinsic base regions and an emitter region.

8. In a process for forming a transistor in a substrate containing a plurality of transistors, the steps of:
   (a) depositing a photo resist over an oxide covered semiconductor substrate containing a sub-collector region;
   (b) etching away a continuous ring of said photo resist in surrounding non-overlapping relation to said sub-collector region physically independent of adjacent transistor sites;
   (c) ion implanting a dopant through said ring into said substrate to define a channel stopper area;
   (d) annealling said substrate to drive said dopant into said substrate to form a channel stopper region; and
   (e) forming an oxide in covering relation to said channel stopper region and in surrounding contacting relation to said sub-collector region.

9. A process as set forth in claim 8 wherein said channel stopper region has a width in the range of 1 to 2.5 microns.

10. A process as set forth in claim 8 including the further steps of:
    (a) depositing a layer of polycrystalline silicon over said substrate;
    (b) forming an oxide layer over said polycrystalline silicon layer;
    (c) depositing a silicon nitride layer over said oxide layer;
    (d) exposing portions of the oxide layer underlying said nitride layer;
    (e) oxidizing the exposed oxide layer through the underlying polycrystalline silicon layer to the epitaxial layer and such that the grown oxide and the unetched sandwiched layers of silicon nitride, oxide and polycrystalline silicon over said epitaxial layer exhibit substantially similar resistances to ion implant;
    (f) ion implanting a first base dopant into said epitaxial layer through the overlying grown oxide and the sandwiched layers of silicon nitride, oxide and polycrystalline silicon;
    (g) depositing a first photo resist except over an extrinsic base area of said epitaxial layer;
    (h) ion implanting a second base dopant into said epitaxial layer;
    (i) depositing a second photo resist except over an emitter area;
    (j) ion implanting an emitter dopant into said epitaxial layer; and (k) annealing said substrate to drive said first and second base dopants and said emitter dopant into said epitaxial layer to form transistor extrinsic and intrinsic base regions and an emitter region.

11. A process as set forth in claim 9 wherein said channel stopper region is separated from said sub-collector a distance in the range of 2 to 6 microns.

12. In a process for forming a transistor, the steps of:
(a) depositing a photo resist over an oxide covered semiconductor substrate containing a sub-collector region;
(b) etching away a continuous ring of said photo resist in surrounding non-overlapping relation to said sub-collector region;
(c) ion implanting a channel stopper dopant through said ring into said substrate to define a channel stopper area;
(d) annealing said substrate to drive said channel stopper dopant into said substrate to form a channel stopper region;
(e) forming an epitaxial layer over said sub-collector region;
(f) forming isolation regions through said epitaxial layer over said channel stopper region in surrounding contacting relation to said sub-collector region;
(g) depositing a photo resist over said substrate except in collector sinker areas;
(h) ion implanting a sinker dopant into said collector sinker areas;
(i) annealing said substrate to drive said sinker dopant into said substrate to form a transistor collector region;
(j) depositing a layer of a polycrystalline silicon;
(k) thermally forming a silicon dioxide layer over said polycrystalline silicon layer;
(l) depositing a silicon nitride layer;
(m) etching away portions of said nitride layer to expose portions of the oxide layer over said isolation regios and said epitaxial layer;
(n) thermally oxidizing the oxide layer and polycrystalline silicon layer in the areas of exposure to define a base area and an emitter area within said epitaxial layer and such that the grown oxide and the unetched sandwiched layers of silicon nitride, silicon oxide and polycrystalline silicon over said epitaxial layer exhibit substantially similar resistance to implant; and
(o) ion implanting a base dopant into said epitaxial layer through the overlying grown oxide and the sandwiched layers of silicon nitride, silicon oxide and polycrystalline silicon.

13. A process as set forth in claim 12 including the further steps of:
(a) depositing a first photo resist over said isolation region and a first portion of said epitaxial layer; and
(b) ion implanting a second base dopant into said epitaxial layer.

14. A process as set forth in in claim 12 including the step of chemically growing a silicon oxide layer over said substrate prior to depositing said polycrystalline silicon layer.

15. A process as set forth in claim 12 wherein said channel stopper region has a width in the range of 1 to 2.5 microns.

16. A process as set forth in claim 12 wherein said channel stopper region is separated from said sub-collector a distance in the range of 2 to 6 microns.

17. A process as set forth in claim 14 wherein said chemical oxide is grown to a thickness in the range of 10 to 40 angstroms.

18. A process as set forth in claim 17 wherein said chemical oxide is grown by sequentially exposing said substrate to caros acid, $H_2O/HF$ 7:1, $NH_4OH/H_2O_2/H_2O$ and $HCl/H_2O_2/H_2O$.

19. In a process for forming a transistor in a semiconductor substrate having a plurality of transistor sites, the steps of:
(a) implanting a channel stopper dopant into said substrate in a continuous non-contacting ring around a sub-collector region of at least one transistor site and physically independent of adjacent transistor sites;
(b) forming a field oxide insulator in the space between adjacent sites and over said channel stopper and a portion of said transistor site.

20. A process for forming a transistor in a semiconductor substrate having a plurality of transistor sites, the steps of:
(a) implanting a channel stopper dopant into said substrate in a continuous non-contacting ring around a sub-collector region of at least one transistor site;
(b) forming an oxide insulator in the space between adjacent sites and over said channel stopper and a portion of said transistor site;
(c) depositing a layer of a polycrystalline silicon over said transistor site;
(d) forming an oxide layer over said polycrystalline silicon layer;
(e) depositing a silicon nitride layer over said oxide layer;
(f) exposing portions of the oxide layer underlying said nitride layer;
(g) oxidizing the exposed oxide layer through the underlying polycrystalline silicon layer to the epitaxial layer to electrically define a base area and an emitter area within said epitaxial layer and such that the thus formed oxide and the unetched sandwiched layers of silicon nitride, oxide and polycrystalline silicon over said epitaxial layer exhibit substantially similar resistances to ion implant; and
(h) implanting a dopant through the overlying grown oxide and the sandwiched layers of silicon nitride, oxide and polycrystalline silicon into said epitaxial layer, whereby a uniform vertical doping profile is obtained.

21. In a process for forming a transistor, the steps of:
(a) depositing a layer of a polycrystalline silicon over a first surface of a semiconductor substrate including a plurality of transistor sites isolated from one another by a surrounding electrical insulator wherein each transistor site includes an epitaxial layer and a lower-lying sub-collector region which sub-collector region is separately surrounded by a doped channel stopper ring narrower than and beneath said insulator and spaced away from said sub-collector;
(b) forming an oxide layer over said polycrystalline silicon layer;
(c) depositing a silicon nitride layer over said oxide layer;
(d) exposing portions of the oxide layer over said epitaxial layer;
(e) oxidizing the exposed oxide layer through the underlying polycrystalline silicon layer to the epitaxial layer to electrically define a base area and an emitter area within said epitaxial layer and such that the thus grown oxide and the unetched sandwiched layers of silicon nitride, oxide and polycrystalline silicon over said epitaxial layer exhibit substantially similar resistances to ion implant; and (f) ion implanting at least one base dopant into said epitaxial layer through the overlying grown oxide and the sandwiched layers of silicon nitride, oxide and polycrystalline silicon.

* * * * *